(12) United States Patent
Chen et al.

(10) Patent No.: US 12,099,098 B2
(45) Date of Patent: Sep. 24, 2024

(54) DETECTION CIRCUIT FOR ON-BOARD DIRECT CURRENT/DIRECT CURRENT (DC/DC) GROUND WIRE AND ON-BOARD DEVICE

(71) Applicant: Shinry Technologies Co., Ltd., Guangdong (CN)

(72) Inventors: Lijun Chen, Guangdong (CN); Renhua Wu, Guangdong (CN)

(73) Assignee: Shinry Technologies Co., Ltd., Guangdong (CN)

( * ) Notice: Subject to any disclaimer, the term of this patent is extended or adjusted under 35 U.S.C. 154(b) by 153 days.

(21) Appl. No.: 18/094,531

(22) Filed: Jan. 9, 2023

(65) Prior Publication Data
US 2023/0160976 A1 May 25, 2023

Related U.S. Application Data

(63) Continuation of application No. PCT/CN2020/101311, filed on Jul. 10, 2020.

(51) Int. Cl.
*G01R 31/66* (2020.01)
*G01R 19/00* (2006.01)
*G01R 31/00* (2006.01)

(52) U.S. Cl.
CPC ......... *G01R 31/66* (2020.01); *G01R 19/0038* (2013.01); *G01R 31/006* (2013.01)

(58) Field of Classification Search
CPC .. G01R 31/66; G01R 19/0038; G01R 31/006; G01R 31/52; B60L 9/12; B60L 53/22; H02M 3/00
See application file for complete search history.

(56) References Cited

U.S. PATENT DOCUMENTS

2008/0093924 A1* 4/2008 Matsumoto .......... G01R 31/006
307/10.1
2009/0313494 A1* 12/2009 Wang ...................... G06F 1/26
713/340
(Continued)

FOREIGN PATENT DOCUMENTS

CN 1499211 A 5/2004
CN 101267959 A 9/2008
(Continued)

OTHER PUBLICATIONS

EPO, Extended European Search Report for corresponding European Patent Application No. 20943999.1, Oct. 13, 2023, 16 pages.
(Continued)

*Primary Examiner* — Jermele M Hollington
*Assistant Examiner* — Zannatul Ferdous
(74) *Attorney, Agent, or Firm* — IP Spring

(57) ABSTRACT

A detection circuit for the on-board direct current/direct current (DC/DC) ground wire and an on-board device are provided. The circuit includes a digital signal process (DSP) controller, a detection circuit, a standby circuit for an on-board DC/DC converter, and a power-supply negative wire for the on-board DC/DC converter. The detection circuit includes a comparator, a first conductive branch, a second conductive branch, a third conductive branch. In this way, the detection circuit is connected between the DSP controller and the standby circuit for the on-board DC/DC converter, and the detection circuit is connected between the DSP controller and the power-supply negative wire for the on-board DC/DC converter.

20 Claims, 5 Drawing Sheets

(56) References Cited

U.S. PATENT DOCUMENTS

2017/0328950 A1\* 11/2017 Deng .................. G01B 7/20
2021/0063494 A1 3/2021 Katsukura et al.

FOREIGN PATENT DOCUMENTS

| CN | 103534918 A | 1/2014 |
| CN | 108072781 A | 5/2018 |
| CN | 207677430 U | 7/2018 |
| CN | 213354193 U | 6/2021 |
| EP | 3327451 A1 | 5/2018 |
| JP | 3307173 B2 | 7/2002 |
| WO | 2019016867 A1 | 1/2019 |

OTHER PUBLICATIONS

CNIPA, International Search Report for International Patent Application No. PCT/CN2020/101311, Apr. 9, 2021, 6 pages.
CNIPA, Written Opinion for International Patent Application No. PCT/CN2020/101311, Apr. 9, 2021, 7 pages.
CNIPA, First Office Action for corresponding Chinese Patent Application No. CN202080006016.7, Mar. 22, 2022, 8 pages.

\* cited by examiner

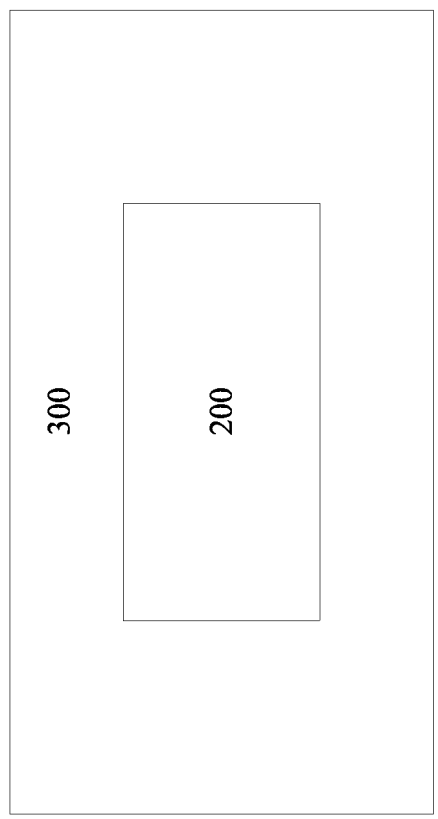

DETECTION CIRCUIT FOR ON-BOARD DIRECT CURRENT/DIRECT CURRENT (DC/DC) GROUND WIRE AND ON-BOARD DEVICE

CROSS-REFERENCE TO RELATED APPLICATIONS

This application is a continuation of under 35 U.S.C. § 120 International Application No. PCT/CN2020/101311, filed Jul. 10, 2020, the entire disclosure of which is incorporated herein by reference.

TECHNICAL FIELD

This disclosure relates to the field of electronic circuits technology, and in particular to a detection circuit for an on-board direct current/direct current (DC/DC) ground wire and an on-board device.

BACKGROUND

At present, new energy vehicles have been increasingly recognized due to requirements of environmental protection, and uses of the new energy vehicles are increasingly popular. Since a new energy vehicle uses a power lithium battery to drive a motor to obtain power, a direct current generator driven by an internal combustion engine through a belt is no longer used, but is replaced by an on-board DC/DC converter.

However, since a load of a low-voltage electric apparatus of the whole vehicle ranges from 1 KW to 3 KW, the on-board DC/DC converter also needs to have an ability to provide an output ranging from 1 KW to 3 KW, and an output current ranges from 70 A to 200 A. Due to a relatively large current, a required output copper cable also has a relatively large cross-sectional area, and is expensive. In order to save costs, a positive electrode of the on-board DC/DC converter is connected with a low-voltage storage battery generally through only one output wire, a negative electrode of the on-board DC/DC converter is directly connected with a vehicle frame through a nearby a ground wire, and the low-voltage storage battery is also connected with the vehicle frame through a nearby ground wire. An output current of the on-board DC/DC converter flows from the positive electrode of the on-board DC/DC converter to the low-voltage storage battery through the output wire, and then flows back to the on-board DC/DC converter through a ground wire of a negative electrode of the low-voltage storage battery, a vehicle body, and a DC/DC ground wire.

However, this wiring manner has a side effect as follows. The low-voltage storage battery is required to supply power for the on-board DC/DC converter. A standby circuit for the on-board DC/DC converter has a positive input and a negative input. The positive input of the standby circuit is controlled by an on-board controller to be on or off to control a DC/DC to be on or off, and the negative input of the standby circuit is connected with the vehicle body by being connected with the negative electrode of the low-voltage storage battery. If the DC/DC ground wire or the ground wire of the low-voltage storage battery is in poor contact with the vehicle body, a relatively large impedance or even a disconnection may occur between the DC/DC ground wire or the ground wire of the low-voltage storage battery and the vehicle body, thereby resulting in a current of hundreds of amperes flowing back to the DC/DC through a shielding layer or a negative wire of the standby circuit. Finally, a wiring harness will be heated seriously until the wiring harness is burned up.

SUMMARY

In a first aspect, a detection circuit for an on-board DC/DC ground wire is provided in implementations of the present disclosure. The detection circuit for the on-board DC/DC ground wire includes a digital signal process (DSP) controller, a detection circuit, a standby circuit for an on-board DC/DC converter, and a power-supply negative wire for the on-board DC/DC converter. The DSP controller is connected with the detection circuit. The detection circuit is connected with the standby circuit for the on-board DC/DC converter and the power-supply negative wire for the on-board DC/DC converter respectively. The detection circuit is further connected with an external input voltage. The detection circuit includes a comparator, a first conductive branch, a second conductive branch, and a third conductive branch. The comparator includes a positive input end and a negative input end. The positive input end is connected with the second conductive branch. The negative input end is connected with the first conductive branch.

In a second aspect, an on-board device is provided in the present disclosure. The on-board device includes a detection circuit for an on-board DC/DC ground wire. The detection circuit for the on-board DC/DC ground wire includes a DSP controller, a detection circuit, a standby circuit for an on-board DC/DC converter, and a power-supply negative wire for the on-board DC/DC converter. The DSP controller is connected with the detection circuit. The detection circuit is connected with the standby circuit for the on-board DC/DC converter and the power-supply negative wire for the on-board DC/DC converter respectively. The detection circuit is further connected with an external input voltage. The detection circuit includes a comparator, a first conductive branch, a second conductive branch, and a third conductive branch. The comparator includes a positive input end and a negative input end. The positive input end is connected with the second conductive branch. The negative input end is connected with the first conductive branch.

BRIEF DESCRIPTION OF THE DRAWINGS

In order to more clearly explain technical situations in implementations or the related art of the present disclosure, the following will briefly introduce accompanying drawings involved in implementations or the related art of the present disclosure.

FIG. 5 is a schematic diagram of an on-board device provided in implementations of the present disclosure.

DETAILED DESCRIPTION

Figure 1:
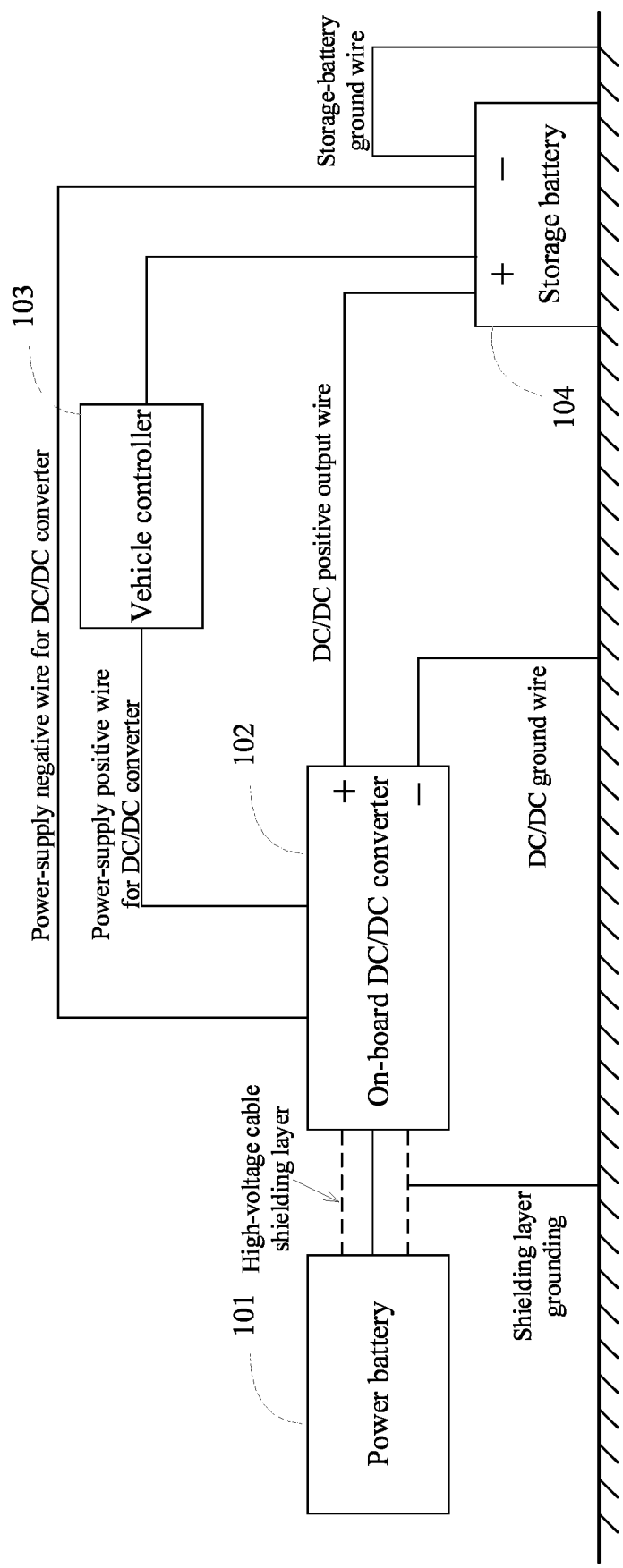
FIG. 1 is a schematic structural diagram of a wiring circuit for a ground wire of an on-board direct current/direct current (DC/DC) converter provided in implementations of the present disclosure.

In order to make those of ordinary skill in the art better understand technical solutions of the present disclosure, technical solutions of implementations of the present disclosure will be described clearly and completely with reference to accompanying drawings in implementations. Apparently, implementations described hereinafter are merely some implementations, rather than all implementations of the present disclosure. All other implementations obtained by those of ordinary skill in the art based on implementations without creative efforts shall fall within the protection scope of the present disclosure.

The terms "first", "second", and the like used in the specification, the claims, and the accompany drawings of the present disclosure are used to distinguish different objects rather than describe a particular order. The terms "include", "comprise", and "have" as well as variations thereof are intended to cover non-exclusive inclusion. For example, a process, system, product, or device including a series of steps or units is not limited to the listed steps or units, on the contrary, it can optionally include other steps or units that are not listed; alternatively, other steps or units inherent to the process, product, or device can be included either.

The term "implementation" referred to herein means that particular features, structures, or properties described in conjunction with implementations may be defined in at least one implementation of the present disclosure. The phrase "implementation" appearing in various places in the specification does not necessarily refer to the same implementation or an independent/alternative implementation that is mutually exclusive with other implementations. Those of ordinary skill in the art will understand expressly and implicitly that an implementation described herein may be combined with other implementations.

In order to better explain implementations of the present disclosure, a large current in implementations of the present disclosure may mean that an electronic component in a circuit consumes a larger current than normal, and a range of the large current has exceeded a standard current, which is an electronic fault phenomenon.

A detection circuit for an on-board direct current/direct current (DC/DC) ground wire is provided in implementations of the present disclosure, which is beneficial to detecting a disconnection of a ground wire and avoiding a wiring harness from being burned up due to a continuous output of an excessive current.

In a first aspect, a detection circuit for an on-board DC/DC ground wire is provided in implementations of the present disclosure. The detection circuit for the on-board DC/DC ground wire includes a digital signal process (DSP) controller, a detection circuit, a standby circuit for an on-board DC/DC converter, and a power-supply negative wire for the on-board DC/DC converter. The DSP controller is connected with the detection circuit. The detection circuit is connected with the standby circuit for the on-board DC/DC converter and the power-supply negative wire for the on-board DC/DC converter respectively. The detection circuit is further connected with an external input voltage. The detection circuit includes a comparator, a first conductive branch, a second conductive branch, and a third conductive branch. The comparator includes a positive input end and a negative input end. The positive input end is connected with the second conductive branch. The negative input end is connected with the first conductive branch.

In an implementation, the first conductive branch includes a first resistor, a second resistor, and a first capacitor. The first resistor has one end connected with the external input voltage. The first resistor has another end connected with the negative input end of the comparator, one end of the second resistor, and one end of the first capacitor. Another end of the second resistor and another end of the first capacitor are grounded.

In an implementation, the second conductive branch includes a third resistor, a fourth resistor, and a second capacitor. The third resistor has one end connected with the external input voltage. The third resistor has another end connected with one end of the fourth resistor, the positive input end of the comparator, and one end of the second capacitor. Another end of the fourth resistor and another end of the second capacitor are connected with the power-supply negative wire for the on-board DC/DC converter.

In an implementation, the third conductive branch includes a fifth resistor. The fifth resistor has one end connected with the standby circuit for the on-board DC/DC converter and grounded. The fifth resistor has another end connected with the power-supply negative wire for the on-board DC/DC converter.

In an implementation, the first conductive branch and the second conductive branch are connected with the external input voltage. The second conductive branch is connected with the third conductive branch and the power-supply negative wire for the on-board DC/DC converter.

In an implementation, the comparator is a voltage comparator. A positive input voltage of the comparator is supplied from the external input voltage via a third resistor and a fourth resistor, and a negative input voltage of the comparator is supplied from the external input voltage via a first resistor and a second resistor.

In an implementation, the DSP controller is configured to control the standby circuit for the on-board DC/DC converter to be on or off.

In an implementation, the DSP controller is further configured to control the standby circuit for the on-board DC/DC converter to increase or reduce an output current.

In a second aspect, an on-board device is provided in the present disclosure. The on-board device includes a detection circuit for an on-board DC/DC ground wire. The detection circuit for the on-board DC/DC ground wire includes a DSP controller, a detection circuit, a standby circuit for an on-board DC/DC converter, and a power-supply negative wire for the on-board DC/DC converter. The DSP controller is connected with the detection circuit. The detection circuit is connected with the standby circuit for the on-board DC/DC converter and the power-supply negative wire for the on-board DC/DC converter respectively. The detection circuit is further connected with an external input voltage. The detection circuit includes a comparator, a first conductive branch, a second conductive branch, and a third conductive branch. The comparator includes a positive input end and a negative input end. The positive input end is connected with the second conductive branch. The negative input end is connected with the first conductive branch.

In implementations of the present disclosure, the detection circuit for the on-board DC/DC ground wire includes the DSP controller, the detection circuit, the standby circuit for the on-board DC/DC converter, and the power-supply negative wire for the on-board DC/DC converter. The DSP controller is connected with the detection circuit. The detection circuit is connected with the standby circuit for the on-board DC/DC converter and the power-supply negative wire for the on-board DC/DC converter respectively. The detection circuit is further connected with the external input voltage. The detection circuit includes the comparator, the first conductive branch, the second conductive branch, and the third conductive branch. The comparator includes the positive input end and the negative input end. The positive input end is connected with the second conductive branch. The negative input end is connected with the first conductive branch. In this way, the detection circuit is connected between the DSP controller and the standby circuit for the on-board DC/DC converter, and the detection circuit is connected between the DSP controller and the power-supply negative wire for the on-board DC/DC converter. Once the ground wire of the DC/DC converter is in poor contact with or even disconnected with the vehicle body, or the ground wire of the low-voltage storage battery is in poor contact with or even disconnected with the vehicle body, a current of hundreds of amperes is generated, the detection circuit can detect a large current in the power-supply negative wire for the on-board DC/DC converter due to a disconnection or a poor contact of the ground wire of the DC/DC converter, thereby avoiding the wiring harness from being burned up due to the continuous output of the large current.

Reference can be made to FIG. 1, which is a schematic structural diagram of a wiring circuit for a ground wire of an on-board DC/DC converter provided in implementations of the present disclosure. The wiring circuit may include a power battery 101, an on-board DC/DC converter 102, a vehicle controller 103, and a storage battery 104. The power battery 101 is connected with the on-board DC/DC converter 102 through a high-voltage cable shielding layer. The on-board DC/DC converter 102 is connected with a negative electrode of the storage battery 104 through a power-supply negative wire for the on-board DC/DC converter. The on-board DC/DC converter 102 is connected with the vehicle controller 103 through a power-supply positive wire for the on-board DC/DC converter. The vehicle controller 103 is connected with a positive electrode of the storage battery 104. The positive electrode of the storage battery 104 is connected with the on-board DC/DC converter 102 through an on-board DC/DC positive output wire. The negative electrode of the storage battery 104 is connected with a vehicle frame or a vehicle body through a storage-battery ground wire. The on-board DC/DC converter 102 is connected with the vehicle frame or the vehicle body through a DC/DC ground wire. The high-voltage cable shielding layer is connected with the vehicle frame or the vehicle body through a ground wire. The high-voltage cable shielding layer is connected with the vehicle frame or the vehicle body to keep a shielding effect. The storage battery 104 is configured to supply power for the on-board DC/DC converter 102. The vehicle controller 103 is configured to control the on-board DC/DC converter 102 to be on or off.

Optionally, an operation principle of the wiring circuit for the ground wire of the on-board DC/DC converter illustrated in FIG. 1 is as follows. In normal cases, the on-board DC/DC converter 102 is connected with the vehicle frame or the vehicle body through one DC/DC ground wire, and the storage battery 104 is connected with the vehicle frame or the vehicle body through one storage-battery ground wire. An output current of the on-board DC/DC converter 102 flows from the positive electrode of the on-board DC/DC converter 102 to the storage battery 104 through the on-board DC/DC positive output wire, and then flows back to the on-board DC/DC converter 102 through the storage-battery ground wire, the vehicle body or the vehicle frame, and the DC/DC ground wire.

In the wiring circuit illustrated in FIG. 1, the storage battery 104 is required to supply power for the on-board DC/DC converter 102. In the meanwhile, a standby circuit is inside the on-board DC/DC converter 102, and the standby circuit has a positive input and a negative input. The positive input of the standby circuit is controlled by the vehicle controller 103 to be on or off, so as to control the on-board DC/DC converter 102 to be on or off. The negative input of the standby circuit inside the on-board DC/DC converter 102 is connected with the vehicle body by being connected with the negative electrode of the storage battery 104. In abnormal cases, if the DC/DC ground wire is in poor contact with the vehicle body or the vehicle frame, or the storage-battery ground wire of the storage battery 104 is in poor contact with the vehicle body or the vehicle frame, a relatively large impedance or even a disconnection of the storage-battery ground wire may occur between the DC/DC ground wire or the storage-battery ground wire of the storage battery 104 and the vehicle body or the vehicle frame. Finally, a current of hundreds of amperes flowing back to the on-board DC/DC converter 102 through the high-voltage cable shielding layer or a negative wire of the standby circuit for the on-board DC/DC converter 102, thereby resulting in severe heating of the wiring harness until the wiring harness is burned up.

Implementations of the present disclosure are described in detail below in combination with the accompanying drawings.

Figure 2:
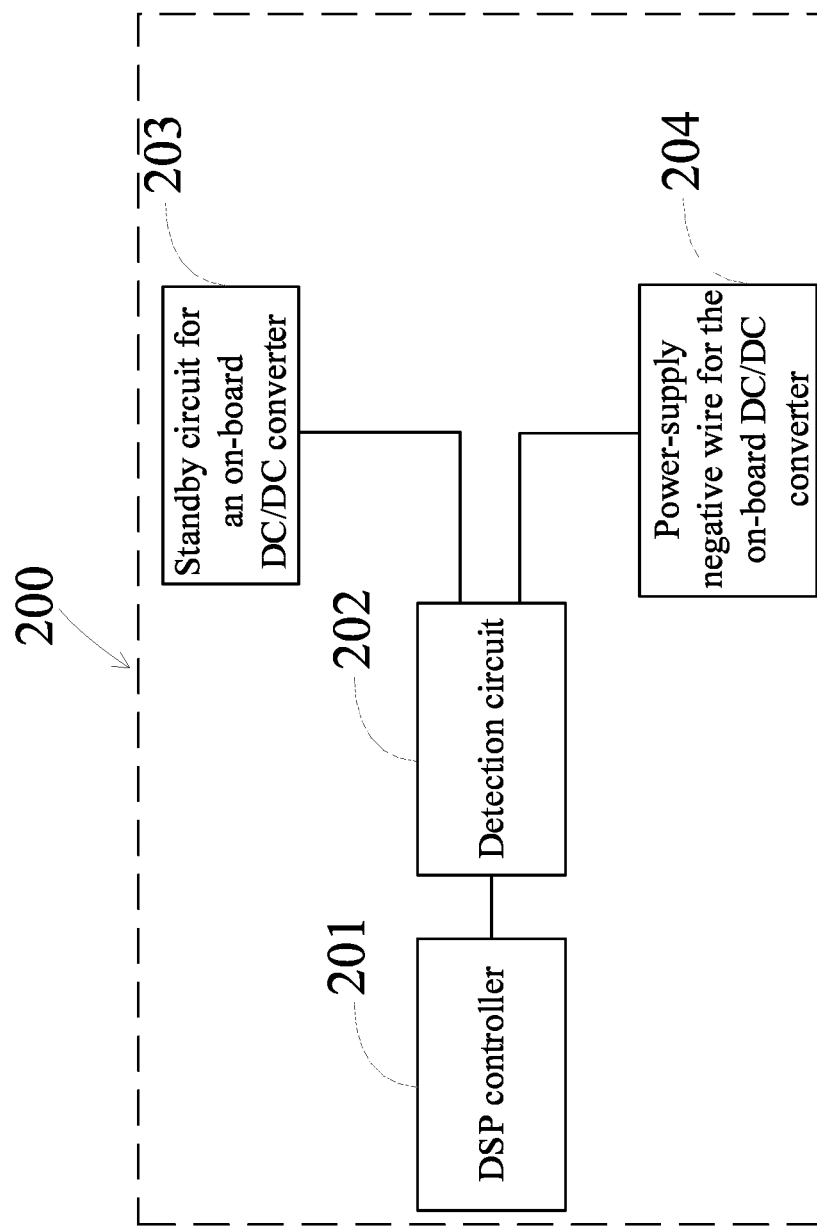
FIG. 2 is a schematic structural diagram of a detection circuit for an on-board DC/DC ground wire provided in implementations of the present disclosure.

Reference can be made to FIG. 2, which is a schematic structural diagram of a detection circuit for an on-board DC/DC ground wire provided in implementations of the present disclosure. The detection circuit for the on-board DC/DC ground wire 200 includes a DSP controller 201, a detection circuit 202, a standby circuit for the on-board DC/DC converter 203, and a power-supply negative wire for the on-board DC/DC converter 204. The DSP controller 201 is connected with the detection circuit 202. The detection circuit 202 is connected with the standby circuit for the on-board DC/DC converter 203 and the power-supply negative wire for the on-board DC/DC converter 204 respectively. The detection circuit 202 is also connected with an external input voltage.

In addition, the DSP controller 201 may be configured to control the standby circuit for the on-board DC/DC converter 203 to increase or reduce an output current and may be configured to control an on or off state of the standby circuit for the on-board DC/DC converter 203. The detection circuit 202 may be configured to detect an operation of the standby circuit for the on-board DC/DC converter 203. For example, the detection circuit 202 may be configured to detect the disconnection or the poor contact of the ground wire in the standby circuit for the on-board DC/DC converter 203.

Optionally, the detection circuit for the on-board DC/DC ground wire 200 illustrated in the schematic structural diagram of FIG. 2 can detect an abnormal case of the wiring circuit of the ground wire connected with the on-board DC/DC converter 102 illustrated in FIG. 1, such as, the disconnection or the poor contact of the ground wire. Specifically, in implementations of the present disclosure, the detection circuit 202 is connected between the DSP controller 201 and standby circuit for the on-board DC/DC converter 203, and the detection circuit 202 is connected between the DSP controller 201 and the power-supply negative wire for the on-board DC/DC converter 204. Once the ground wire of the DC/DC converter 102 is in poor contact with or even disconnected with the vehicle body, or the ground wire of the storage battery is in poor contact with or even disconnected with the vehicle body, a current of hundreds of amperes is generated, the above detection circuit 202 can detect a large current in the power-supply negative wire for the on-board DC/DC converter 204 or a shielding wire due to the disconnection or the poor contact of the ground wire of the DC/DC converter 102, thereby avoiding the wiring harness from being burned up due to a continuous output of the large current and avoiding an electronic fault phenomenon of the large current.

Figure 3:
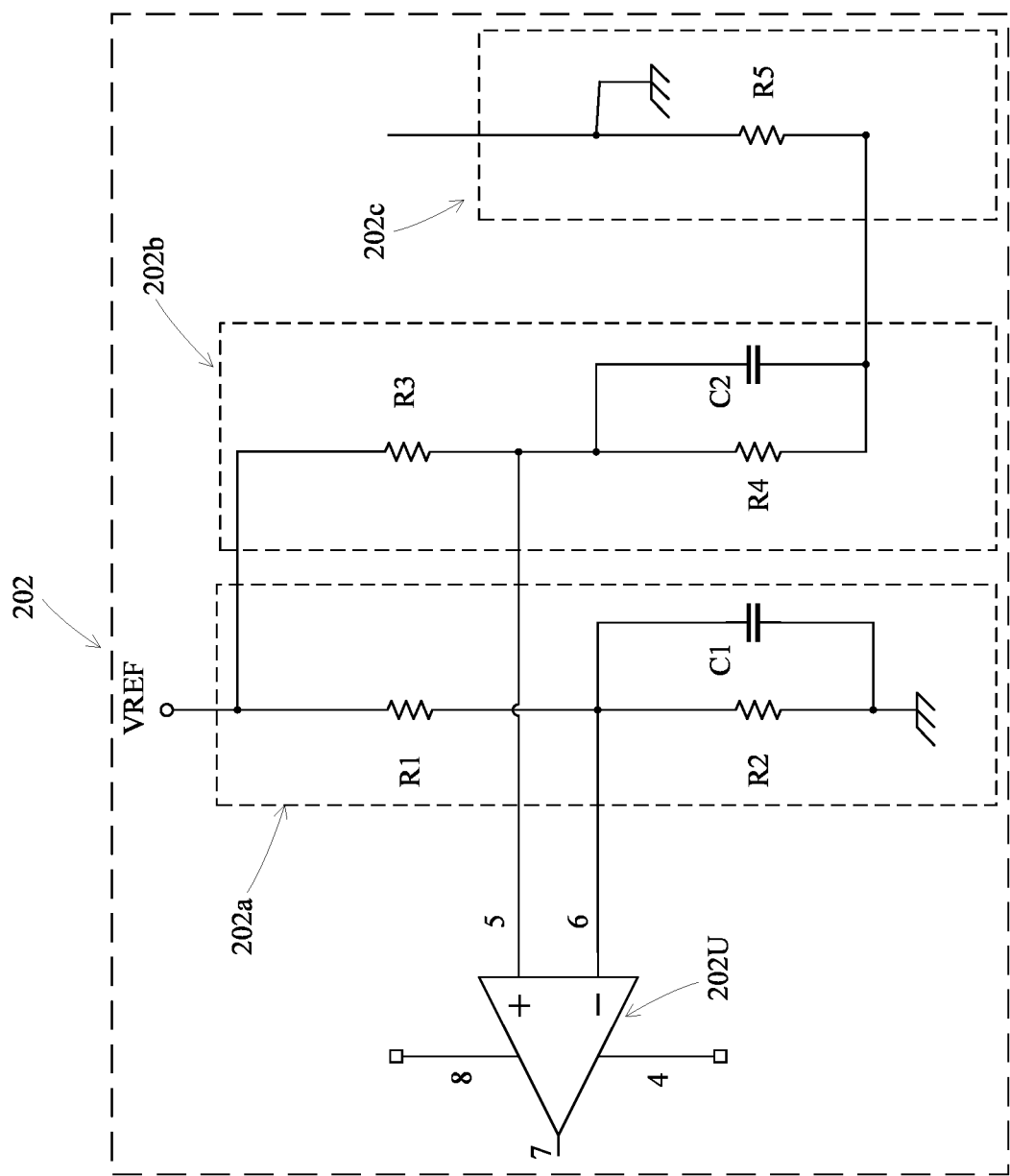
FIG. 3 is a schematic structural diagram of a detection circuit provided in implementations of the present disclosure.

Reference can be made to FIG. 3, which is a schematic structural diagram of a detection circuit provided in implementations of the present disclosure. The detection circuit 202 includes a comparator 202U, a first conductive branch 202a, a second conductive branch 202b, and a third conductive branch 202c.

Optionally, the first conductive branch 202a includes first resistor R1, second resistor R2, and first capacitor C1. First resistor R1 has one end connected with external input voltage VREF. First resistor R1 has another end connected with a negative input end (i.e., a port 6) of the comparator 202U, one end of second resistor R2, and one end of first capacitor C1. Another end of second resistor R2 and another end of first capacitor C1 are grounded.

Optionally, the second conductive branch 202b includes third resistor R3, fourth resistor R4, and second capacitor C2. Third resistor R3 has one end connected with external input voltage VREF. Third resistor R3 has another end connected with one end of fourth resistor R4, a positive input end (i.e., a port 5) of the comparator 202U, and one end of second capacitor C2. Another end of fourth resistor R4 and another end of second capacitor C2 are connected with the power-supply negative wire for the on-board DC/DC converter.

Optionally, the third conductive branch 202c includes fifth resistor R5. Fifth resistor R5 has one end connected with the standby circuit for the on-board DC/DC converter and grounded. Fifth resistor R5 has another end connected with the power-supply negative wire for the on-board DC/DC converter.

Optionally, the first conductive branch 202a and the second conductive branch 202b are connected with the external input voltage. The second conductive branch 202b is connected with the third conductive branch 202c and the power-supply negative wire for the on-board DC/DC converter.

Optionally, the comparator 202U in the above detection circuit for the on-board DC/DC ground wire 200 may include a voltage comparator, which is not specifically limited herein. A positive input voltage of the comparator 202U is supplied from the external input voltage via third resistor R3 and fourth resistor R4, and a negative input voltage of the comparator 202U is supplied from the external input voltage via first resistor R1 and second resistor R2.

Figure 4:
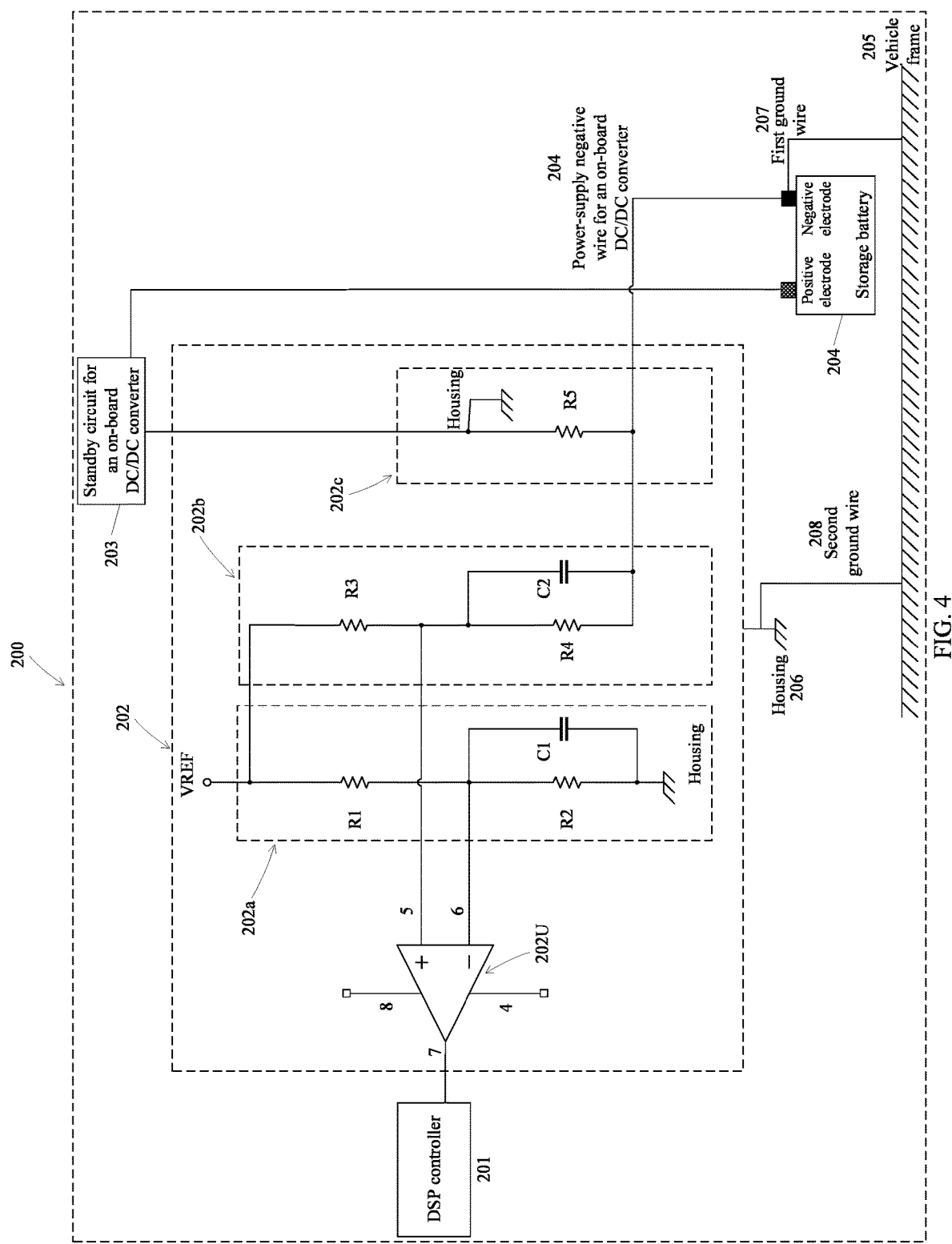
FIG. 4 is a schematic structural diagram of a detection circuit for an on-board DC/DC ground wire provided in other implementations of the present disclosure.

Reference can be made to FIG. 4, which is a schematic structural diagram of a detection circuit for an on-board DC/DC ground wire provided in other implementations of the present disclosure. The detection circuit for the on-board DC/DC ground wire 200 includes a DSP controller 201, a detection circuit 202, a standby circuit for an on-board DC/DC converter 203, a power-supply negative wire for the on-board DC/DC converter 204, a storage battery 104, a vehicle frame 205, and a housing 206. The detection circuit 202 includes a comparator 202U, a first conductive branch 202a, a second conductive branch 202b, and a third conductive branch 202c.

Optionally, the DSP controller 201 is connected with a port 7 of the comparator 202U in the detection circuit 202. The second conductive branch 202b of the detection circuit 202 is connected with an external input voltage. The third conductive branch 202c of the detection circuit 202 is connected with the standby circuit for the on-board DC/DC converter. The second conductive branch 202b of the detection circuit 202 and the third conductive branch 202c each are connected with the power-supply negative wire for the on-board DC/DC converter. The above detection circuit 202 can be connected with the housing 206 and the vehicle frame 205 through a second ground wire 208. In implementations of the present disclosure, since the housing 206 and the vehicle frame 205 are connected with ground in a vehicle system, a connection with the housing or the vehicle frame is equivalent to grounding.

Optionally, the above standby circuit for the on-board DC/DC converter 203 is connected with a positive electrode of the storage battery 104. The second conductive branch 202b and the third conductive branch 202c of the above detection circuit 202 are connected with a negative electrode of the storage battery 104 through the power-supply negative wire for the on-board DC/DC converter 204. The negative electrode of the storage battery 104 is connected with the vehicle frame 205 through a first ground wire 207, and the housing 206 is connected with the vehicle frame 205 through the second ground wire 208.

The comparator 202U includes a positive input end and a negative input end. The positive input end is connected with the second conductive branch 202b, and the negative input end is connected with the first conductive branch 202a.

Optionally, the first conductive branch 202a includes first resistor R1, second resistor R2, and first capacitor C1. First resistor R1 has one end connected with external input voltage VREF. First resistor R1 has another end connected with the negative input end (i.e., a port 6) of the comparator, one end of second resistor R2, and one end of first capacitor C1. Another end of second resistor R2 and another end of first capacitor C1 are connected with the vehicle frame.

Optionally, the second conductive branch 202b includes third resistor R3, fourth resistor R4, and second capacitor C2. Third resistor R3 has one end connected with external input voltage VREF. Third resistor R3 has another end connected with one end of fourth resistor R4, the positive input end (i.e., a port 5) of the comparator 202U, and one end of second capacitor C2. Another end of fourth resistor R4 and another end of second capacitor C2 are connected with the power-supply negative wire for the on-board DC/DC converter 204.

Optionally, the third conductive branch 202c includes fifth resistor R5. Fifth resistor R5 has one end connected with the standby circuit for the on-board DC/DC converter 203 and the housing 206. Fifth resistor R5 has another end connected with the power-supply negative wire for the on-board DC/DC converter 204.

Optionally, the first conductive branch 202a and the second conductive branch 202b are connected with the external input voltage. The second conductive branch 202b is connected with the third conductive branch 202c and the power-supply negative wire for the on-board DC/DC converter 204.

Optionally, the comparator 202U in the above detection circuit for the on-board DC/DC ground wire 200 may include a voltage comparator, which is not specifically limited herein. A positive input voltage of the comparator is supplied from the external input voltage via third resistor R3 and fourth resistor R4, and a negative input voltage of the comparator 202U is supplied from the external input voltage via first resistor R1 and second resistor R2.

Optionally, the above fifth resistor R5 has a resistance at a level of milliohm, such that a normal operation of the standby circuit for the on-board DC/DC converter will not be affected, and an abnormal operation of the DC/DC standby circuit will not occur.

Optionally, the above DSP controller 201 is configured to control the standby circuit for the on-board DC/DC converter 203 to be on or off, such that if the DC/DC ground wire is detected to be abnormal, the DSP controller 201 can directly control the DC/DC converter to be off, thereby avoiding the wiring harness in the circuit from being burned out or burned up.

Optionally, the DSP controller circuit is further configured to control the standby circuit for the on-board DC/DC converter to increase or reduce an output current, such that the DSP controller can control the DC/DC converter to reduce the output current if an excessive current flowing through the DC/DC ground wire or the high-voltage cable shielding layer is detected, thereby avoiding the wiring harness from being burned up due to the continuous output of the excessive current.

Optionally, an operation principle of the detection circuit for the on-board DC/DC ground wire illustrated in FIG. 4 is as follows. During normal operation, the standby circuit for the on-board DC/DC converter has a very small supply current, such that a voltage drop across the power-supply negative wire for the on-board DC/DC converter is also very low, which can be regarded as the same as a low level of the vehicle body. In implementations of the present disclosure, by setting resistances of first resistor R1, second resistor R2, third resistor R3, and fourth resistor R4, a voltage of the negative input end of the comparator is higher than a voltage of the positive input end of the comparator, such that the comparator outputs a low level. The power-supply negative wire for the on-board DC/DC converter and the negative electrode of the storage battery are connected with the vehicle frame through the first ground wire. If the first ground wire is in poor contact with or disconnected with the vehicle frame, a relatively large current will be generated and flow back to the standby circuit for the on-board DC/DC converter through the power-supply negative wire for the on-board DC/DC converter. When the relatively large current flows through fifth resistor R5 with the resistance at the level of milliohm, a relatively large voltage drop can be generated, such that a voltage of the power-supply negative wire for the on-board DC/DC converter is higher than a voltage of the vehicle body or the vehicle frame. Finally, the positive input voltage of the comparator is higher than the negative input voltage of the comparator, and the comparator outputs a high level to the DSP controller. Here, the DSP controller controls the DC/DC converter to reduce the output current or turns off the DC/DC converter, thereby avoiding the wiring harness in the vehicle system from being burned up due to the continuous output of the large current.

It can be seen that in implementations of the present disclosure, the detection circuit is connected between the DSP controller and the standby circuit for the on-board DC/DC converter, and the detection circuit is connected between the DSP controller and the power-supply negative wire for the on-board DC/DC converter. Once the ground wire connected with the power-supply negative wire for the on-board DC/DC converter is in poor contact with or even disconnected with the vehicle body, or the ground wire of the low-voltage storage battery is in poor contact with or even disconnected with the vehicle body, a current of hundreds of amperes is generated, the above detection circuit can detect a large current in the power-supply negative wire for the DC/DC converter or a shielding wire due to the disconnection or the poor contact of the ground wire of the standby circuit for the DC/DC converter, such that the DSP controller controls the standby circuit for the on-board DC/DC converter to reduce the output current or controls the standby circuit for the on-board DC/DC converter to be off. The above large current may mean that a device in the circuit consumes a larger current than normal, thereby avoiding the electronic fault phenomenon of the large current.

In a possible implementation, an on-board device is provided in implementations of the present disclosure. Reference can be made to FIG. 5, which is a schematic diagram of an on-board device provided in implementations of the present disclosure. The on-board device 300 includes the detection circuit for the on-board DC/DC ground wire 200 provided in any of the above implementations. The detection circuit for the on-board DC/DC ground wire 200 in the on-board device 300 is the same as the detection circuit for the on-board DC/DC ground wire 200 described in any of the above implementations, and will not be repeated herein.

It should be noted that for the sake of simplicity, the above implementations of the present disclosure are described as a series of action combinations. However, it will be appreciated by those of ordinary skill in the art that implementations are not limited by the sequence of actions described. According to implementations, some steps or operations may be performed in other orders or simultaneously. Besides, it will be appreciated by those of ordinary skill in the art that implementations described in the specification are exemplary implementations, and the actions and modules involved are not necessarily essential to the present disclosure.

In the above implementations, the description of each implementation has its own emphasis. For the parts not described in detail in one implementation, reference may be made to related descriptions in other implementations.

In implementations of the present disclosure, it should be understood that the apparatus disclosed in implementations provided in the present disclosure may be implemented in other manners. For example, the device/apparatus implementations described above are merely illustrative; for instance, the division of the unit is only a logical function division and there can be other manners of division during actual implementations, for example, multiple units or assemblies may be combined or may be integrated into another system, or some features may be ignored, omitted, or not performed. In addition, coupling or communication connection between each illustrated or discussed component may be direct coupling or communication connection, or may be indirect coupling or communication among devices or units via some interfaces, and may be electrical connection or other forms of connection.

The units described as separate components may or may not be physically separated, the components illustrated as units may or may not be physical units, that is, they may be in the same place or may be distributed to multiple network elements. Part or all of the units may be selected according to actual needs to achieve the purpose of the technical solutions of implementations.

In addition, the functional units in various implementations of the present disclosure may be integrated into one processing unit, or each unit may be physically present, or two or more units may be integrated into one unit. The above unit integrated may be implemented in the form of hardware or in the form of a software functional unit.

The above implementations in the present disclosure are described in detail. Principles and implementations of the present disclosure are elaborated with specific implementations herein. The above illustration of implementations is only used to help to understand methods and core ideas of the present disclosure. In the meanwhile, for those of ordinary skill in the art, according to ideas of the present disclosure, there will be changes in specific implementation manners and application scope. To sum up, contents of this specification should not be understood as limitation on the present disclosure.

What is claimed is:

1. A detection circuit for an on-board direct current/direct current (DC/DC) ground wire, the detection circuit comprising:
a digital signal process (DSP) controller, a detection circuit, a standby circuit for an on-board DC/DC converter, and a power-supply negative wire for the on-board DC/DC converter, wherein:
the DSP controller is connected with the detection circuit, the detection circuit is connected with the standby circuit for the on-board DC/DC converter and the power-supply negative wire for the on-board DC/DC converter respectively, and the detection circuit is further connected with an external input voltage;
the detection circuit comprises a comparator, a first conductive branch, a second conductive branch, and a third conductive branch; and
the comparator comprises a positive input end and a negative input end, wherein the positive input end is connected with the second conductive branch, and wherein the negative input end is connected with the first conductive branch.

2. The detection circuit for the on-board DC/DC ground wire of claim 1, wherein the first conductive branch comprises a first resistor, a second resistor, and a first capacitor, and wherein:
the first resistor has one end connected with the external input voltage,
the first resistor has another end connected with the negative input end of the comparator, one end of the second resistor, and one end of the first capacitor, and
another end of the second resistor and another end of the first capacitor are grounded.

3. The detection circuit for the on-board DC/DC ground wire of claim 1, wherein the second conductive branch comprises a third resistor, a fourth resistor, and a second capacitor, and wherein:
the third resistor has one end connected with the external input voltage,
the third resistor has another end connected with one end of the fourth resistor, the positive input end of the comparator, and one end of the second capacitor, and
another end of the fourth resistor and another end of the second capacitor are connected with the power-supply negative wire for the on-board DC/DC converter.

4. The detection circuit for the on-board DC/DC ground wire of claim 1, wherein the third conductive branch comprises a fifth resistor, wherein:
the fifth resistor has one end connected with the standby circuit for the on-board DC/DC converter and a housing, and
the fifth resistor has another end connected with the power-supply negative wire for the on-board DC/DC converter.

5. The detection circuit for the on-board DC/DC ground wire of claim 1, wherein:
the first conductive branch and the second conductive branch are connected with the external input voltage, and
the second conductive branch is connected with the third conductive branch and the power-supply negative wire for the on-board DC/DC converter.

6. The detection circuit for the on-board DC/DC ground wire of claim 1, wherein the comparator is a voltage comparator, and wherein:
a positive input voltage of the comparator is supplied from the external input voltage via a third resistor and a fourth resistor, and
a negative input voltage of the comparator is supplied from the external input voltage via a first resistor and a second resistor.

7. The detection circuit for the on-board DC/DC ground wire of claim 4, wherein the fifth resistor has a resistance at a level of milliohm.

8. The detection circuit for the on-board DC/DC ground wire of claim 1, wherein the DSP controller is configured to control the standby circuit for the on-board DC/DC converter to be on or off.

9. The detection circuit for the on-board DC/DC ground wire of claim 8, wherein the DSP controller is further configured to control the standby circuit for the on-board DC/DC converter to increase or decrease an output current.

10. The detection circuit for the on-board DC/DC ground wire of claim 1, further comprising a storage battery, a vehicle frame, and a housing, wherein:
the standby circuit for the on-board DC/DC converter is connected with a positive electrode of the storage battery,
the second conductive branch and the third conductive branch are connected with a negative electrode of the storage battery through the power-supply negative wire for the on-board DC/DC converter,
the negative electrode of the storage battery is connected with the vehicle frame through a first ground wire, and
the housing is connected with the vehicle frame through a second ground wire.

11. An on-board device, comprising:
a detection circuit for an on-board direct current/direct current (DC/DC) ground wire, wherein the detection circuit for the on-board DC/DC ground wire includes a digital signal process (DSP) controller, a detection circuit, a standby circuit for an on-board DC/DC converter, and a power-supply negative wire for the on-board DC/DC converter, wherein:
the DSP controller is connected with the detection circuit, the detection circuit is connected with the standby circuit for the on-board DC/DC converter and the power-supply negative wire for the on-board DC/DC converter respectively, and the detection circuit is further connected with an external input voltage;
the detection circuit comprises a comparator, a first conductive branch, a second conductive branch, and a third conductive branch; and
the comparator comprises a positive input end and a negative input end, wherein the positive input end is connected with the second conductive branch, and wherein the negative input end is connected with the first conductive branch.

12. The on-board device of claim 11, wherein the first conductive branch comprises a first resistor, a second resistor, and a first capacitor, and wherein:
the first resistor has one end connected with the external input voltage,
the first resistor has another end connected with the negative input end of the comparator, one end of the second resistor, and one end of the first capacitor, and
another end of the second resistor and another end of the first capacitor are grounded.

13. The on-board device of claim 11, wherein the second conductive branch comprises a third resistor, a fourth resistor, and a second capacitor, and wherein:
- the third resistor has one end connected with the external input voltage,
- the third resistor has another end connected with one end of the fourth resistor,
- the positive input end of the comparator, and one end of the second capacitor, and
- another end of the fourth resistor and another end of the second capacitor are connected with the power-supply negative wire for the on-board DC/DC converter.

14. The on-board device of claim 11, wherein the third conductive branch comprises a fifth resistor, and wherein:
- the fifth resistor has one end connected with the standby circuit for the on-board DC/DC converter and a housing, and
- the fifth resistor has another end connected with the power-supply negative wire for the on-board DC/DC converter.

15. The on-board device of claim 11, wherein:
- the first conductive branch and the second conductive branch are connected with the external input voltage, and
- the second conductive branch is connected with the third conductive branch and the power-supply negative wire for the on-board DC/DC converter.

16. The on-board device of claim 11, wherein the comparator is a voltage comparator, and wherein:
- a positive input voltage of the comparator is supplied from the external input voltage via a third resistor and a fourth resistor, and
- a negative input voltage of the comparator is supplied from the external input voltage via a first resistor and a second resistor.

17. The on-board device of claim 14, wherein the fifth resistor has a resistance at a level of milliohm.

18. The on-board device of claim 11, wherein the DSP controller is configured to control the standby circuit for the on-board DC/DC converter to be on or off.

19. The on-board device of claim 18, wherein the DSP controller is further configured to control the standby circuit for the on-board DC/DC converter to increase or decrease an output current.

20. The on-board device of claim 11, wherein the detection circuit for the on-board DC/DC ground wire further comprises a storage battery, a vehicle frame, and a housing, and wherein:
- the standby circuit for the on-board DC/DC converter is connected with a positive electrode of the storage battery,
- the second conductive branch and the third conductive branch are connected with a negative electrode of the storage battery through the power-supply negative wire for the on-board DC/DC converter,
- the negative electrode of the storage battery is connected with the vehicle frame through a first ground wire, and
- the housing is connected with the vehicle frame through a second ground wire.

* * * * *